United States Patent

Rajagopalan et al.

Patent Number: 6,156,382
Date of Patent: *Dec. 5, 2000

[54] CHEMICAL VAPOR DEPOSITION PROCESS FOR DEPOSITING TUNGSTEN

[75] Inventors: Ravi Rajagopalan; Steve Ghanayem, both of Sunnyvale, Calif.; Manabu Yamazaki, Chiba, Japan; Keiichi Ohtsuka, Chiba, Japan; Yuji Maeda, Chiba, Japan

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/857,658

[22] Filed: May 16, 1997

[51] Int. Cl.$^7$ .................................................. C23C 16/14
[52] U.S. Cl. .................... 427/250; 427/253; 427/255.28; 427/255.39
[58] Field of Search ..................................... 427/250, 253, 427/255, 255.1, 255.28, 255.39

[56] References Cited

U.S. PATENT DOCUMENTS

| | | |
|---|---|---|
| 4,699,805 | 10/1987 | Seelback et al. . |
| 4,957,775 | 9/1990 | Black et al. ............................ 427/253 |
| 5,028,565 | 7/1991 | Chang et al. . |
| 5,043,299 | 8/1991 | Chang et al. . |
| 5,250,467 | 10/1993 | Somekh et al. . |
| 5,306,666 | 4/1994 | Izumi .................................. 427/255.1 |
| 5,328,722 | 7/1994 | Ghanayem et al. ..................... 427/253 |
| 5,342,652 | 8/1994 | Foster et al. ............................ 427/253 |
| 5,407,698 | 4/1995 | Emesh .................................... 427/250 |
| 5,433,975 | 7/1995 | Roberts et al. ....................... 427/255.1 |
| 5,769,951 | 6/1998 | van de Ven et al. . |
| 5,795,824 | 8/1998 | Hancock ................................. 427/253 |

FOREIGN PATENT DOCUMENTS 4-74865 3/1992 Japan .
8-264530 10/1996 Japan .

OTHER PUBLICATIONS

Takayuki Ohba et al., "Selective CVD Tungsten Silicide for VLSI Applications," *International Electron Devices Meeting*, Washington, D.C. Dec. 6–9, 1987, pp. 213–216. Dec. 1987.

Takayuki Ohba, "Advanced Multilevel Metallization Technology," *Applied Surface Science*, 91 pp. 1–11, (1995).

T. Hara et al., "Low Resistivity Tungsten Film Using Diborane Reduction," *Conference Proceedings ULSI–IX–1994 Materials Research Society*–San Diego, CA Oct. 5–7, 1993, pp. 353–358, Oct. 1993.

Takayuki Ohba et al., "Chemical Vapour Deposition of Tungsten by the Reduction of $WF_6$ Using Si, $SiH_4$, $Si_2H_6$, $Si_3H_8$, $B_2H_6$, $PH_3$, and $H_2$," *J. Instn. Electronics and Telecom. Engrs.*, vol. 37, no. 2, pp. 212–219, (1991).

*Primary Examiner*—Shrive Beck
*Assistant Examiner*—Bret Chen
*Attorney, Agent, or Firm*—Townsend and Townsend and Crew

[57] ABSTRACT

A multiple step chemical vapor deposition process for depositing a tungsten layer on a substrate. A first step of the deposition process includes a nucleation step in which $WF_6$ and $SiH_4$ are introduced into a deposition chamber. Next, the flow of $WF_6$ and $SiH_4$ are stopped and diborane is introduced into the chamber for between 5–25 seconds. Finally, during a bulk deposition step, the $WF_6$ is reintroduced into the chamber along with $H_2$ and $B_2H_6$ flows to deposit a tungsten layer on the substrate. In a preferred embodiment, the bulk deposition step also introduces nitrogen into the process gas.

23 Claims, 6 Drawing Sheets

CHEMICAL VAPOR DEPOSITION PROCESS FOR DEPOSITING TUNGSTEN

BACKGROUND OF THE INVENTION

The present invention relates to the fabrication of integrated circuits. More particularly, the invention provides a technique, including a method and apparatus, for forming improved tungsten (W) films having decreased resistivity.

Deposition of tungsten over a semiconductor substrate is a common step in the formation of some integrated circuit (IC) structures. For example, tungsten is commonly used to provide electrical contact to portions of a semiconductor substrate. These electrical contacts are usually provided through openings in an insulation layer, such as a silicon oxide layer, formed over the substrate. One method used to form such contacts includes the chemical vapor deposition (CVD) of tungsten to fill the opening after an initial layer of titanium nitride has been deposited in the opening. As another example, tungsten is sometimes used to form metal lines over a semiconductor substrate.

One CVD technique that has been employed to deposit tungsten films in the semiconductor industry uses tungsten hexafluoride ($WF_6$) and a hydrogen reducing agent, e.g., $H_2$, as precursor gases. This technique includes two main steps: nucleation and bulk deposition. The nucleation step grows a thin layer of tungsten which acts as a growth site for subsequent film. In addition to $WF_6$ and $H_2$, the process gas used in the nucleation step of this technique includes silane ($SiH_4$), and may also include nitrogen ($N_2$) and argon. A bulk deposition step then is used to form the tungsten film. The bulk deposition gas is a mixture containing $WF_6$, $H_2$, $N_2$, and Ar.

As advances in integrated circuit technology lead to a scaling down of device dimensions and an increase in chip size and complexity, improved methods of depositing tungsten are continuously being sought. Research has been performed using diborane ($B_2H_6$) and other hydrides of Group III or V in place of or in addition to $H_2$ in the process gas for both the nucleation and bulk deposition stages of CVD tungsten deposition. Some of this research suggests that tungsten films deposited from a process gas that includes $B_2H_6$ exhibit reduced resistivity as compared to tungsten films deposited from a process gas without $B_2H_6$.

Despite this discovery, further improvements in the deposition of tungsten films are desirable.

SUMMARY OF THE INVENTION

The present invention provides a method and apparatus for forming an improved tungsten layer. According to the method of the present invention, a hydride presoak step in which a group III or V hydride such as $B_2H_6$ is introduced into a substrate processing chamber for a short time period between the nucleation and bulk deposition steps of a tungsten deposition process. The group III or V hydride is flowed into the chamber in the presoak step without any tungsten-containing source being flowed into the chamber. Preferably, the group III or V hydride is $B_2H_6$ that is diluted to 5 weight percent or less with an inert gas such as argon. Also, an additional source of inert gas such as argon and/or an additional hydrogen reducing agent such as $H_2$ may be introduced to stabilize the gas flow during the presoak step.

In one embodiment of the method of the present invention, a substrate is placed in a deposition zone of a substrate processing chamber and a process gas including $B_2H_6$ is introduced into the deposition zone during a first deposition stage without introducing a tungsten-containing source into the deposition zone Then, during a second deposition stage after the first stage, a process gas including a tungsten-containing source, $B_2H_6$ and a reduction agent is introduced into the deposition zone, and conditions within the deposition zone are maintained so that the deposition zone is suitable for deposition of a tungsten layer on the substrate. Preferably, $B_2H_6$ is flowed into the chamber for between 5 and 20 seconds during the first deposition stage. Tungsten films deposited according to the present invention have decreased resistivity.

In a more preferred embodiment, a tungsten-containing source is introduced into the chamber during a third deposition stage prior to the first deposition stage. Also, the process gas of the second deposition stage includes $WF_6$ as the tungsten-containing source, and $H_2$ as the reduction agent. The process gas of the second deposition stage also includes $B_2H_6$ and $N_2$ sources. The addition of $N_2$ to the process gas in this embodiment reduces the stress and increases the reflectance of the deposited film.

In another embodiment, $N_2$ is added to a process gas that includes a tungsten-containing source, $B_2H_6$ and a reduction agent during a bulk deposition stage. A prior deposition stage where $B_2H_6$ is introduced without a tungsten-containing source is not necessary in this embodiment, but is employed in a more preferred embodiment.

These and other embodiments of the present invention, as well as its advantages and features are described in more detail in conjunction with the text below and attached figures.

DETAILED DESCRIPTION OF THE PREFERRED EMBODIMENTS

I. Introduction

The present invention allows for deposition of an improved tungsten film by introducing a hydride of an element of group III or V, such as $B_2H_6$, into the deposition chamber as a pretreatment step before the bulk deposition of the tungsten layer. Films deposited by the method of the present invention are suitable for use in the fabrication of integrated circuits having feature sizes of 0.35 microns or less. Also, the present invention can be used to deposit tungsten films in CVD chambers of conventional design.

II. Exemplary CVD Reactor Chamber

Figure 1A:
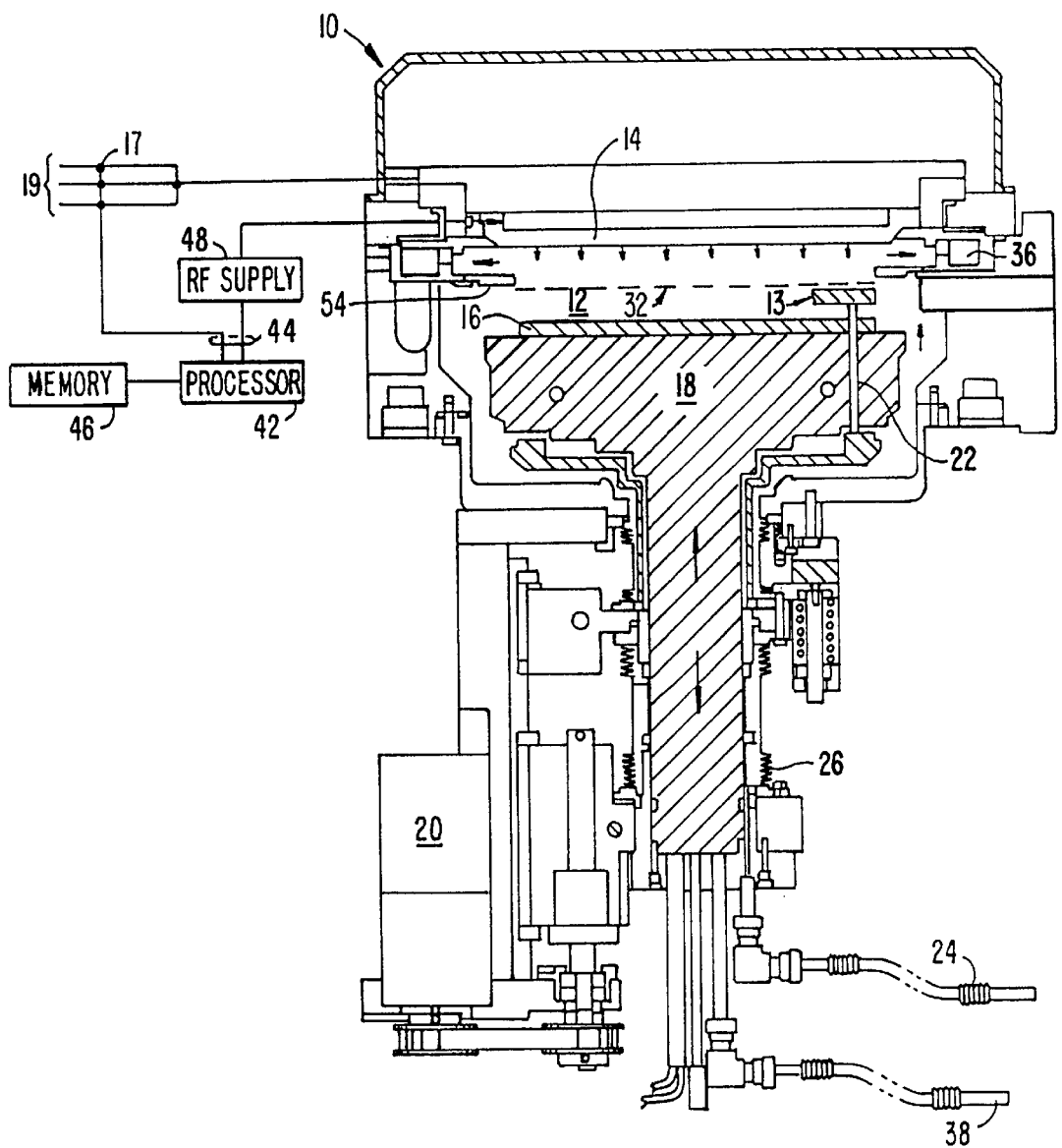
FIG. 1A is a vertical, cross-sectional view of one embodiment of a simplified chemical vapor deposition apparatus according to the present invention.
Figure 1B:
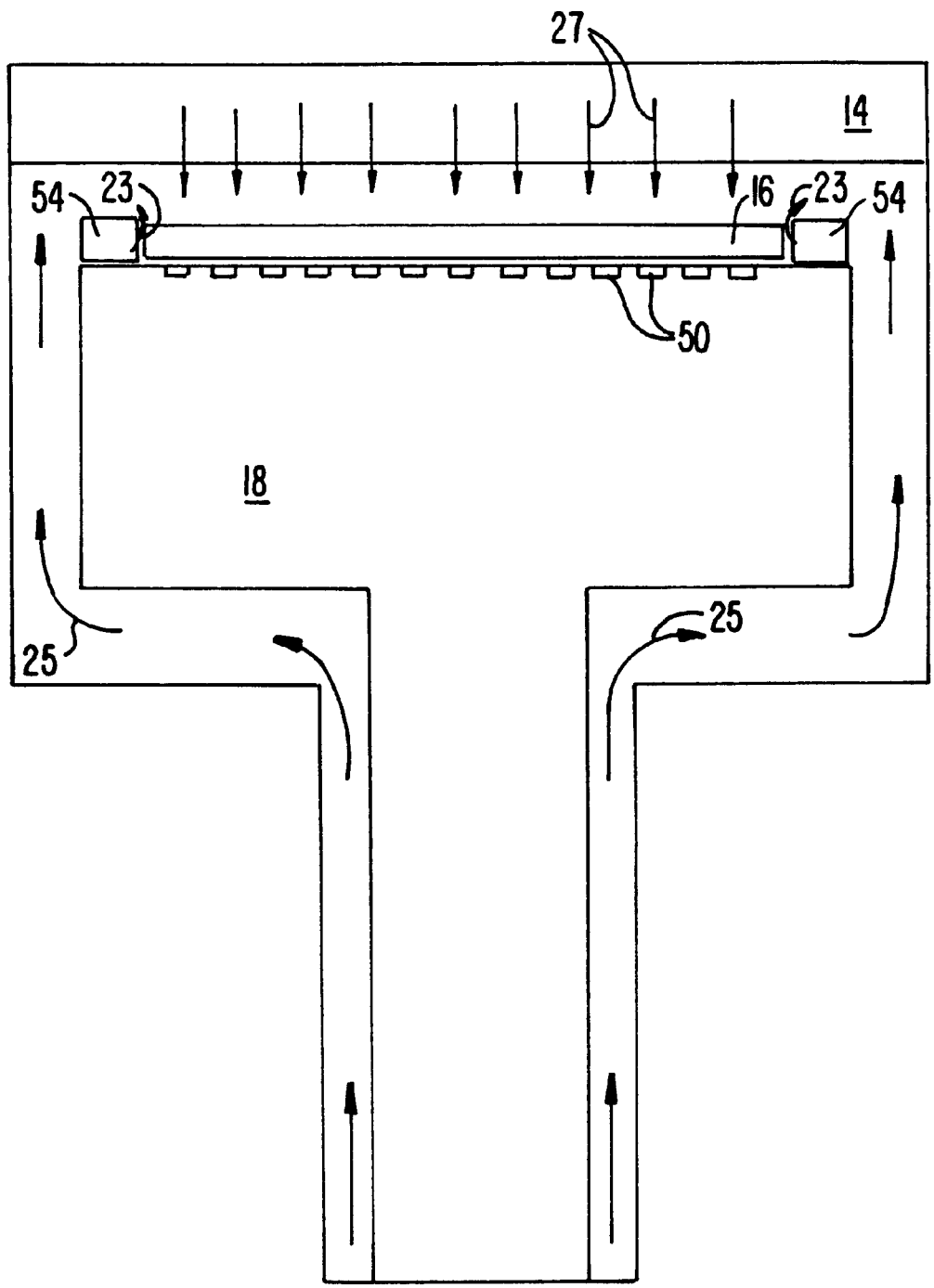
FIG. 1B is a vertical, cross-sectional view of one embodiment of a resistively heated susceptor used in the chamber of FIG. 1 to secure a substrate being processed in chamber.

FIGS. 1A and 1B illustrate one embodiment of a parallel plate, cold-wall chemical vapor deposition system 10 having a vacuum chamber 12 in which the layer according to the present invention can be deposited. CVD System 10 contains a gas distribution manifold 14 for dispersing deposition gases to a wafer 16 that rests on a resistively-heated susceptor 18.

Chamber 12 may be part of a vacuum processing system having multiple processing chambers connected to a central transfer chamber and serviced by a robot. Substrate 16 is brought into chamber 12 by a robot blade through a slit valve in a sidewall of the chamber (not shown). Susceptor 18 is moveable vertically by means of a motor 20. Substrate 16 is brought into the chamber when susceptor 18 is in a first position 13 opposite the slit valve. At position 13, substrate 16 is supported initially by a set of pins 22 that pass through and are coupled to susceptor 18. Pins 22 are driven by a single motor assembly.

As the susceptor is brought to a processing position 32 opposite gas distribution manifold 14 as shown by the dotted line, pins 22 sink into susceptor 18 and substrate 16 is deposited onto the susceptor. Once positioned on susceptor 18, substrate 16 is affixed to the susceptor by a vacuum clamping system (shown in FIG. 1B as grooves 50).

As it moves upward toward processing position 32, substrate 16 contacts purge guide 54, which centers the substrate on the susceptor. Edge purge gases 23 are flowed through purge guide 54 across the edge of substrate 16 to prevent deposition gases from contacting the edge and backside of the substrate. Purge gases 25 are also flowed around heater/susceptor 18 to minimize deposition on an around the heater/susceptor. These purge gases are supplied from a purge line (FIG. 1A, 24) and are also employed to protect stainless steel bellows 26 from damage by corrosive gases introduced into the chamber during processing.

Deposition and carrier gases are supplied to a deposition zone of the chamber through gas lines 19 to manifold 14 in response to the control of valves 17. During processing, gas supplied to manifold 14 is distributed uniformly across the surface of the substrate as shown by arrows 27. Spent processing gases and by-product gases are exhausted from the chamber by means of exhaust system 36. The rate at which gases are released through exhaust system 36 into an exhaust line is controlled by a throttle valve (not shown). During deposition, a second purge gas through gas channels in the susceptor (not shown) and feed line 38 feeds purge gas against the edge of wafer 16 as previously described. An RF power supply 48 can be coupled to manifold 14 to provide for plasma-enhanced CVD (PECVD) cleaning of the chamber.

The throttle valve, gas supply valves 17, motor 20, resistive heater coupled to susceptor 18, RF power supply 48 and other aspects of CVD system 10 are controlled by a processor 42 over control lines 44 (only some of which are shown). Processor 42 operates under the control of a computer program stored in a computer-readable medium such as a memory 46. The computer program dictates the temperature, chamber pressure, timing, mixture of gases, RF power levels, susceptor position, and other parameters of a particular process.

In a preferred embodiment, the system controller includes a hard disk drive (memory 46) a floppy disk drive and a processor 42. The processor contains a singleboard computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 42 controls all of the activities of the CVD machine. The system controller executes system control software, which is a computer program stored in a computer-readable medium such as a memory 46. Preferably, memory 46 is a hard disk drive, but memory 46 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 42.

Figure 1C:
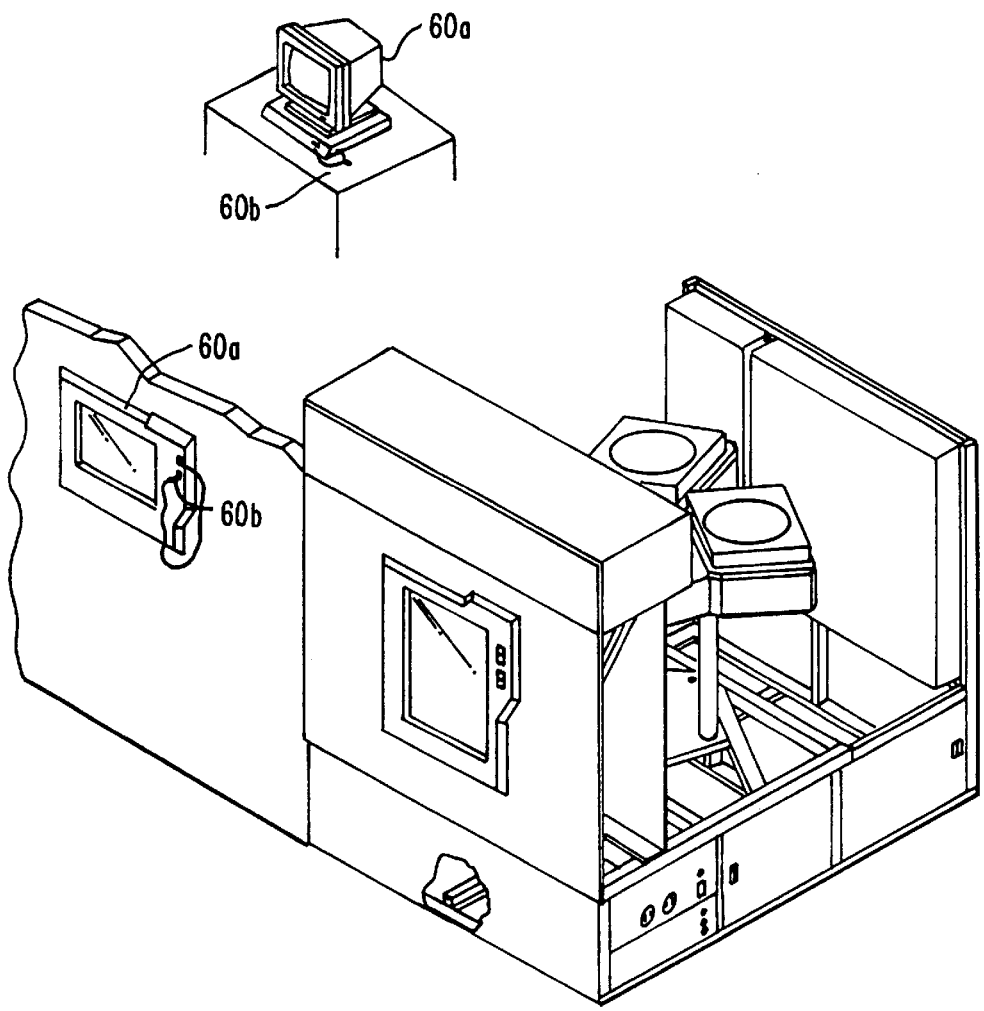
FIG. 1C is a simplified diagram of system monitor and CVD system 100 in a multi-chamber system, which may include one or more chambers.

The interface between a user and controller 42 is via a CRT monitor 60a and light pen 60b, shown in FIG. 1C which is a simplified diagram of the system monitor and CVD system 10 in a substrate processing system, which may include one or more chambers. In the preferred embodiment two monitors 60a are used, one mounted in the clean room wall for the operators and the other behind the wall for the service technicians. The monitors 60a simultaneously display the same information, but only one light pen 60b is enabled. A light sensor in the tip of light pen 60b detects light emitted by CRT display. To select a particular screen or function, the operator touches a designated area of the display screen and pushes the button on the pen 60b. The touched area changes its highlighted color, or a new menu or screen is displayed, confirming communication between the light pen and the display screen. Other devices, such as a keyboard, mouse, or other pointing or communication device, may be used instead of or in addition to light pen 60b to allow the user to communicate with controller 42.

The process for depositing the film can be implemented using a computer program product that is executed by controller 42. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 1D:
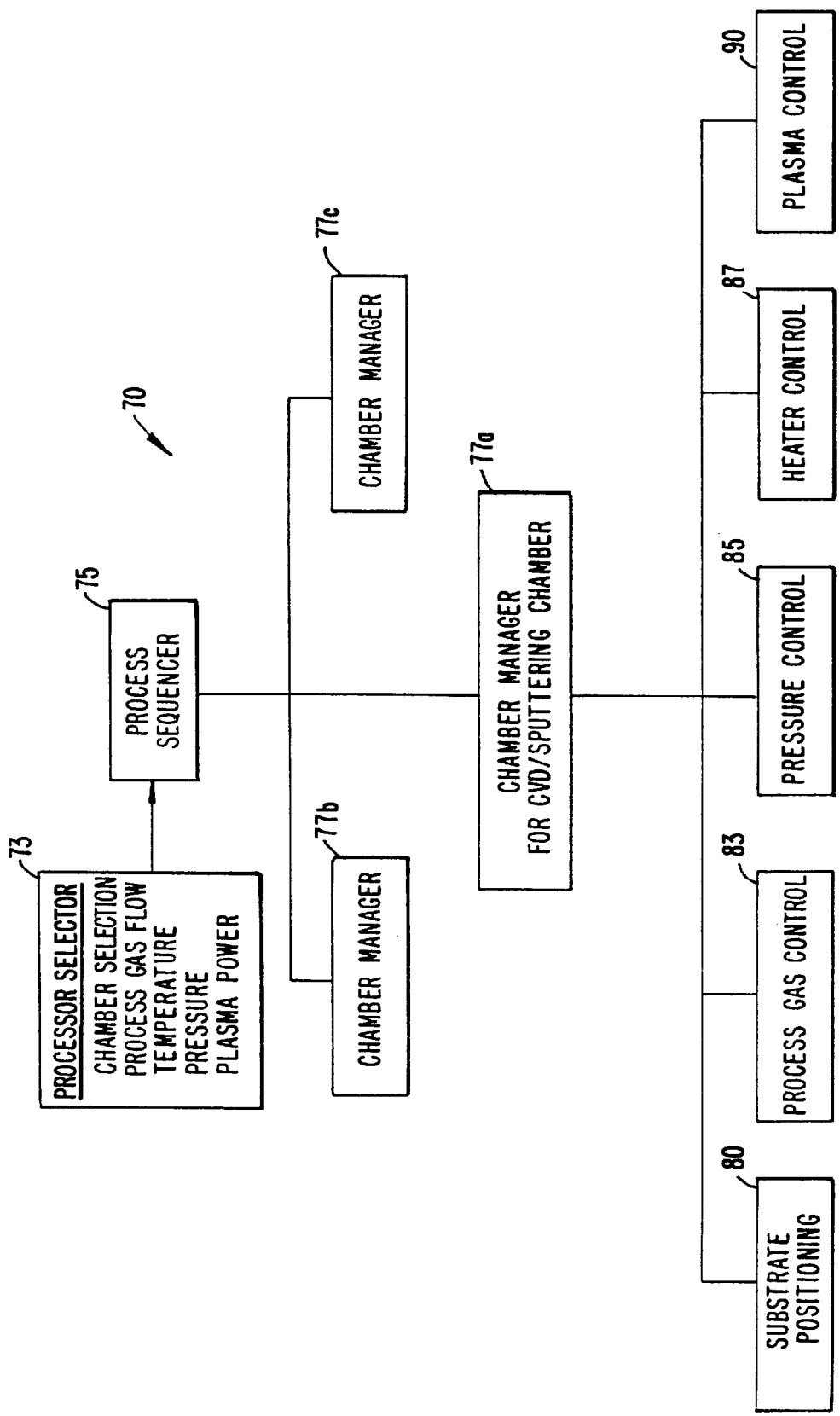
FIG. 1D shows an illustrative block diagram of the hierarchical control structure of the system control software, computer program 170, according to a specific embodiment.

FIG. 1D is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a–c, which controls multiple processing tasks in a process chamber 12 according to the process set determined by the sequencer subroutine 75. For example, the chamber manager subroutine 77a comprises program code for controlling sputtering and CVD process operations in the process chamber 12. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87 and plasma control subroutine 90 in some embodiments. A person having ordinary skill in the art will readily recognize that other chamber control subroutines can be included depending on what processes are to be performed in the process chamber 12. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 12 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1D. The substrate positioning subroutine 80 comprises program code for controlling chamber components that are used to load the substrate onto susceptor 18 and, optionally, to lift the substrate to a desired height in the chamber 12 to control the spacing between the substrate and the gas distribution manifold 14. When a substrate is loaded into the process chamber 12, susceptor 18 is lowered to receive the substrate, and thereafter, the susceptor 18 is raised to the desired height in the chamber, to maintain the substrate at a first distance or spacing from the gas distribution manifold during the CVD process. In operation, the substrate positioning subroutine 80 controls movement of susceptor 18 in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 12 to stabilize the pressure in the chamber before reactive process gases are introduced. For these processes, the process gas control subroutine 83 is programmed to include steps for flowing the inert gas into the chamber 12 for an amount of time necessary to stabilize the pressure in the chamber, and then the steps described above would be carried out.

The pressure control subroutine 85 comprises program code for controlling the pressure in the chamber 12 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 12 by reading one or more conventional pressure manometers connected to the chamber, to compare the measure value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 12 to the desired pressure.

The heater control subroutine 87 comprises program code for controlling the current to a heating unit that is used to heat the substrate 20. The heater control subroutine 87 is also invoked by the chamber manager subroutine 77a and receives a target, or set-point, temperature parameter. The heater control subroutine 87 measures the temperature by measuring voltage output of a thermocouple located in pedestal 12, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat susceptor 18 the heater control subroutine 87 gradually controls a ramp up/down of current applied to the loop. Additionally, a built-in fail-safe mode can be included to detect process safety compliance, and can shut down operation of the heating unit if the process chamber 12 is not properly set up.

In some embodiments, chamber 12 is outfitted with an RF power supply 48 that is used for chamber cleaning or other operations. When a chamber cleaning plasma process is employed, plasma control subroutine 90 comprises program code for setting the frequency RF power levels applied to the process electrodes in the chamber 12. Similar to the previously described chamber component subroutines, the plasma control subroutine 90 is invoked by the chamber manager subroutine 77a.

The above CVD system description is mainly for illustrative purposes and should not be considered as limiting the scope of the present invention. Variations of the above described system, such as variations of platen or susceptor design, heater design, location of RF power connections and others are possible. The method for depositing a tungsten layer according to the present invention is not limited to any specific processing apparatus.

III. Depositing Tungsten Films

Figure 2:
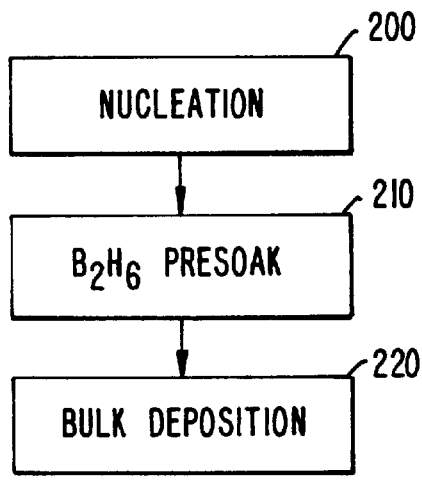
FIG. 2 is a flowchart illustrating the steps of a preferred embodiment of the present invention.

The method of the present invention may be employed to deposit improved tungsten films in a substrate processing chamber, such as the exemplary CVD chamber described above. FIG. 2 illustrates a preferred process of the invention that is used to deposit a tungsten layer over a semiconductor substrate. The process is for exemplary purposes and is not intended to limit the scope of the claims of the present invention. Where applicable, reference numbers in the description below are used to refer to appropriate components of the exemplary chamber of FIGS. 1A–1D. This process is implemented and controlled using a computer program stored in the memory 46 of CVD system 10.

As shown in FIG. 2, the present invention includes a $B_2H_6$ presoak step 210 in between a nucleation step 200 and a bulk deposition step 220. In nucleation step 200, a process gas of $WF_6$, $SiH_4$ and Ar is flowed into chamber 12 for 60 seconds to grow a thin tungsten layer that acts as a growth site for subsequent tungsten film. The flow rates of $WF_6$, $SiH_4$ and Ar during the nucleation step are 5, 2 and 2800 sccm, respectively. Chamber temperature is set to 425° C. while chamber pressure is set to 3.0 torr.

After completion of nucleation step 200, the flows of $WF_6$ and $SiH_4$ gases are stopped, and a solution of 5% $B_2H_6$ diluted with argon is flowed into the chamber along with separate argon and $H_2$ gas flows (step 210) for 10 seconds. The 5% $B_2H_6$ mixture is introduced at a rate of 140 sccm (equivalent to 7 sccm $B_2H_6$), $H_2$ is introduced at 1500 sccm and the additional argon flow is introduced at 1860 sccm. Chamber temperature is kept at 425° C., but pressure is increased to 80 torr. Finally, during bulk deposition step 220, $WF_6$ is added to the process gas at a flow rate of 65 sccm and process conditions are held for 32 seconds.

The above process deposits a tungsten film approximately 2000 Å thick. The film has a resistivity of 10.25 ohms/cm, a fluorine concentration of $1–5 \times 10^{20}$ atoms/cm$^2$ and a boron concentration of $7 \times 10^9$ atoms/cm$^2$.

The inventors have found that tungsten films deposited according to the above method have a larger grain size than films deposited without a $B_2H_6$ presoak step, and thus exhibit decreased resistivity. It is believed that the presence of $B_2H_6$ at the surface of the substrate before the bulk deposition step allows for formation of the larger grain size and reduces the impurity levels within the deposited tungsten film. The $B_2H_6$ presoak step also provides improved uniformity as compared to a CVD tungsten $B_2H_6$ process that does not include such a presoak step.

The length of time that $B_2H_6$ is flowed into the chamber between the nucleation and bulk deposition steps depends on a number of factors such as the rate at which $B_2H_6$ is introduced, the rate at which other gases including $WF_6$ and the $H_2$ are introduced, the volume and design of the chamber it is introduced into, the concentration of $B_2H_6$ introduced, the pressure within the chamber and the temperature of the chamber among others. Generally, flowing $B_2H_6$ for between 5–30 seconds is sufficient. Given the above deposition conditions, most preferably, the $B_2H_6$ presoak step lasts for between 10–20 seconds. At lower chamber pressures and/or lower chamber temperatures, longer $B_2H_6$ presoak steps may be preferred.

Figure 3:
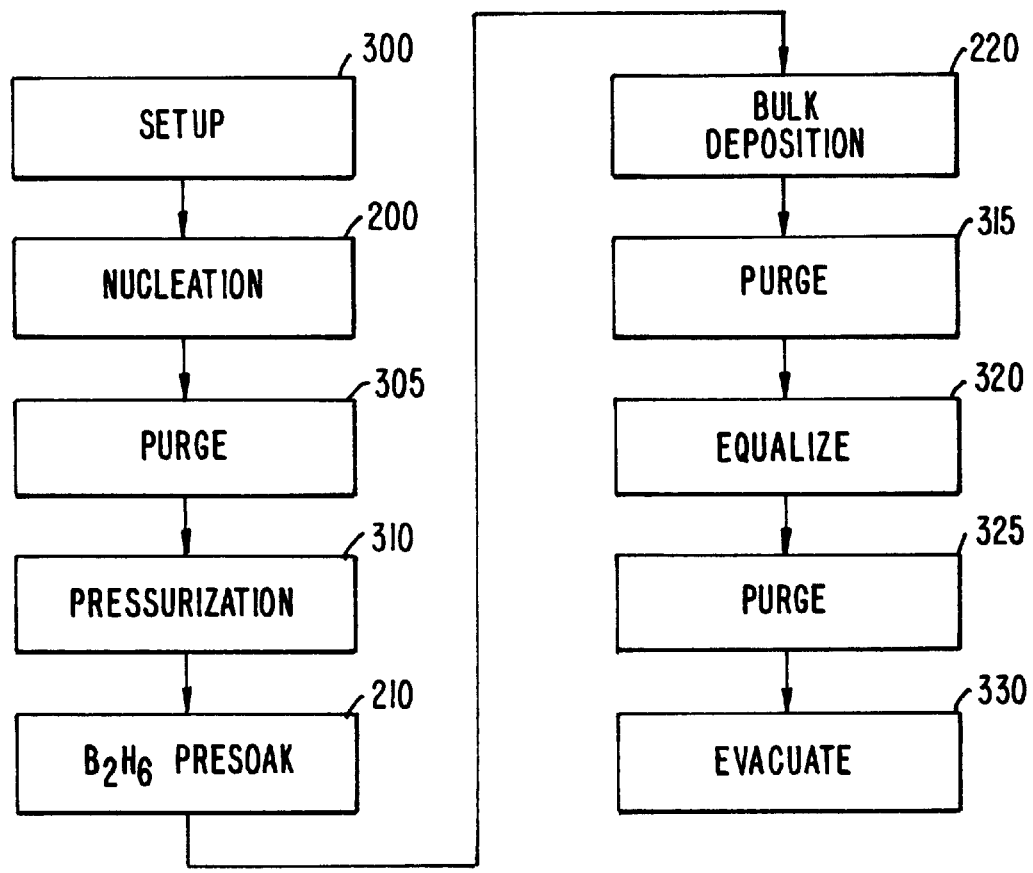
FIG. 3 is a flowchart illustrating the steps of a more preferred embodiment of the present invention.

In a preferred embodiment shown in FIG. 3 various setup, purge and other steps are performed in addition to the nucleation, presoak and bulk deposition steps described with respect to FIG. 2. As shown in FIG. 3, a setup step 300 is performed before nucleation step 200. In set-up step 300, the wafer is first brought up to a temperature of 425° C. (about 7 seconds) and then Ar and $SiH_4$ are flowed into the chamber (2000 sccm and 30 sccm, respectively) for 30 seconds and chamber pressure is set to 30 torr. Argon flow is then increased to 2800 sccm while the wafer is chucked to vacuum chuck 18 (18 seconds). Finally, pressure is reduced to 3 torr just before nucleation step 200 is initiated.

A purge step 305 is employed between steps nucleation step 200 and $B_2H_6$ presoak step 210. In purge step 305, the $SiH_4$ and $WF_6$ gas flows are stopped and Ar and $H_2$ are flowed into the chamber to purge the chamber of residual $WF_6$ and $SiH_4$ gases. The purge step lasts for 5 seconds and flows Ar at a rate of 2800 sccm and $H_2$ at a rate of 1500 sccm. A separate pressurization step 310 is also included where Ar and $H_2$ flows are maintained (the Ar is actually decreased to 2000 sccm while the $H_2$ flow rate is kept at 1500 sccm) after the purge step and the pressure of chamber 12 is brought up to 80 torr for the $B_2H_6$ and subsequent bulk deposition steps. This step also lasts 5 seconds, and then the $B_2H_6$ presoak step 210 is performed. $B_2H_6$ presoak step 210 preferably lasts for between 5–30 seconds, and more preferably, between 10–20 seconds.

After $B_2H_6$ presoak step 210 and bulk deposition step 220 are completed a second purge step 315 is used to purge residual $WF_6$ deposition gases from chamber 12. In this purge step, the $WF_6$ and $B_2H_6$ gas flows are stopped and the Ar flow is increased to 2800 sccm and the $H_2$ flow is increased to 2000 sccm for 5 seconds. Next, in step 320 a 30 sccm flow of $SiH_4$ is introduced 8 seconds, while the wafer is dechucked (disengaged from vacuum clamping system 50). In step 325, the throttle valve is fully opened while the chamber is purged for 3 seconds. In step 330, all gas flows are stopped while the chamber is evacuated.

Figure 4:
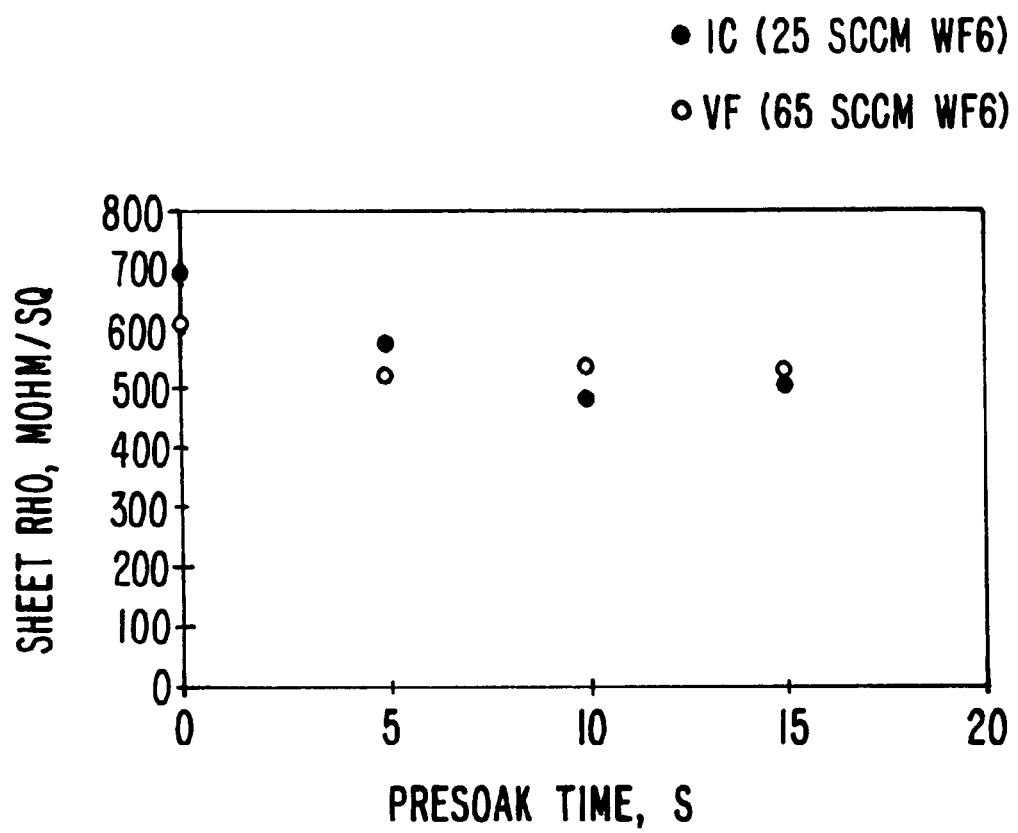
FIG. 4 is a graph comparing the sheet resistance of films deposited with and without the benefits of the present invention.

FIG. 4 is a graph comparing the sheet resistance of tungsten films deposited according to the above described process with and without the inclusion of $B_2H_6$ presoak step 210. In FIG. 4, closed circles represent a process in which the $WF_6$ flow was 25 sccm during bulk deposition step 220 while open circles represent the described process having a $WF_6$ flow of 65 sccm during step 220.

As evident in FIG. 4, the inclusion of $B_2H_6$ presoak step 210 reduced the sheet resistance of the deposited films in both cases. For the 65 sccm $WF_6$ process, a minimum sheet resistance was obtained when the $B_2H_6$ presoak step lasted 10 seconds. The 25 sccm $WF_6$ process exhibited a minimum sheet resistance when the $B_2H_6$ presoak step lasted 15 seconds. Regardless of the exact length of step 210, introducing $B_2H_6$ without the $WF_6$ deposition gas resulted in a deposited tungsten film having significantly reduced sheet resistance as compared to a process without the $B_2H_6$ presoak step (0 sccm $B_2H_6$ flow). Table 1 below includes the measured sheet resistance values depicted graphically in FIG. 4 and also includes sheet resistance values from a similar test in which the $WF_6$ gas flow was set at 95 sccm.

TABLE 1

Sheet Resistance vs. $B_2H_6$ Flow

| | Sheet Resistance (mohm/sq.) | | | | |
|---|---|---|---|---|---|
| $WF_6$ Flow (Sccm) | $B_2H_6$ Flow 0 secs. | $B_2H_6$ Flow 5 secs. | $B_2H_6$ Flow 10 secs. | $B_2H_6$ Flow 15 secs. | $B_2H_6$ Flow 20 secs. |
| 25 | 694.5 | 577.5 | 487.1 | 508.0 | — |
| 65 | 609.6 | 523.5 | 540.9 | 534.7 | — |
| 95 | 652.0 | 566.7 | 564.4 | — | 562.7 |

It is important to accurately control the amount of $B_2H_6$ introduced during bulk deposition step 220. Experiments have shown that resistance and resistivity initially decrease with the addition of $B_2H_6$ to the bulk deposition process gas, but then sharply increase once the amount of $B_2H_6$ introduced reaches a saturation point. In a process similar to the one described above except that $WF_6$ is introduced at 25 sccm, resistivity increased markedly at a $B_2H_6$ flow rate of about 8 sccm (160 sccm of a 5 % $B_2H_6$/argon mixture). Reflectivity, which remained relatively constant at diluted $B_2H_6$ flow rates of between 0 and 100 sccm, also increased markedly at about 160 sccm.

In another experiment, resistivity was measured for tungsten films deposited with and without the inclusion of the $B_2H_6$ presoak step. In this experiment the deposition temperature was 475° C. The nucleation step lasted 25 seconds and introduced $WF_6$, $SiH_4$, Ar and $H_2$ at rates of 20 sccm, 10 sccm, 1000 sccm and 1000 sccm, respectively. The bulk deposition step lasted for 13 seconds and introduced $WF_6$, $H_2$ and Ar at rates of 95 sccm, 700 sccm and 1000 sccm, respectively. When a 3 second $B_2H_6$ presoak step was employed, the rate at which $B_2H_6$ was introduced and varied from between 2–12 sccm as shown below in Table 2. In Table 2, $B_2H_6$ flow is listed as a concentrated value. Actual flow was introduced as diluted solution 5 % $B_2H_6$ and 95 % Ar. Thus, a $B_2H_6$ flow of 10 sccm indicates a flow of 200 sccm diluted $B_2H_6$. As evident from Table 2, sheet resistivity generally decreased upon the introduction of a $B_2H_6$ presoak step and flow of between 4–12 sccm. Also, using these same conditions described above in a 45 second deposition process, a sheet resistivity of 10.08 $\mu\Omega$-cm was measured without a $B_2H_6$ presoak step and flow and a sheet resistivity of 8.91 $\mu\Omega$-cm was measured with with a 8 sccm $B_2H_6$ flow in the presoak and bulk deposition steps.

TABLE 2

Resistivity vs. $B_2H_6$ Flow

| $B_2H_6$ Flow | Resistivity $\mu\Omega$-cm |
|---|---|
| 0 | 13.67 |
| 2 | 14.39 |
| 4 | 11.54 |
| 6 | 13.68 |
| 8 | 10.55 |
| 10 | 11.35 |
| 12 | 12.12 |

In still another set of experiments, stress, reflectivity, uniformity and sheet resistance were measured for tungsten films deposited without the inclusion of $B_2H_6$ presoak step 210 and with and without the inclusion of $B_2H_6$ in the bulk deposition step. In these experiments, deposition temperature was 425° C. The nucleation step lasted for 60 seconds and introduced $WF_6$, $SiH_4$ and Ar at the rates of 5 sccm, 2 sccm and 2800 sccm, respectively. The bulk deposition step lasted for 32 seconds and introduced $WF_6$, $H_2$ and Ar at rates of 65 sccm, 1500 sccm and 2000 sccm, respectively. The results of these experiments are listed below in Table 3. As in Table 2, $B_2H_6$ flow in Table 3 is listed as a concentrated value. As evident from Table 3, sheet resistivity decreased with the addition of $B_2H_6$. Stress, on the other hand, generally increased with $B_2H_6$ flow.

TABLE 3

CVD of Tungsten Films With $B_2H_6$

| $B_2H_6$ Flow (sccm) | Thickness (Å) | Sheet Resistance (mohm/sq) | Uniformity (%) | Reflectivity (% avg*) | Stress (dynes/cm$^2$) |
|---|---|---|---|---|---|
| 0 | 2157 | 718 | 1.71 | 102.8 | 1.583e10 |
| 2 | 2353 | 583 | 3.82 | 104.7 | 1.795e10 |
| 4 | 2157 | 493 | 1.67 | 90.3 | 1.63e10 |
| 6 | 2157 | 460 | 1.1 | 91.6 | 1.985e10 |
| 7 | 2157 | 449 | 1.18 | 98 | 2.221e10 |
| 8 | 2549 | 462 | 3.84 | 110.9 | 2.595e10 |
| 10 | 2941 | 1726 | 45.5 | 125.1 | 2.481e10 |

*Reflectance is an average of 9 points across the wafer

In a most preferred embodiment, nitrogen ($N_2$) is added to the process gas during the bulk deposition phase. Introducing nitrogen during step 220 improves film reflectance, i.e., the deposited film becomes smoother, and also results in the unexpected benefit of reducing stress without adversely effecting other properties such as resistance or uniformity. When nitrogen is added to the standard process gases used to deposit a tungsten layer without using $B_2H_6$, the nitrogen has been shown to increase the stress level of the film. Such an increase is evident from the data shown in Table 4 below, which compares the stress level of tungsten films deposited with and without the inclusion of nitrogen in the process gas. No $B_2H_6$ was included in the process gas in this test.

TABLE 4

Stress vs. $N_2$ Flow - No $B_2H_6$ Added

| $B_2H_6$ Flow (sccm) | $N_2$ Flow (sccm) | Stress (dynes/cm$^2$) |
|---|---|---|
| 0 | 0 | 1.583e10 |
| 0 | 100 | 1.66e10 |
| 0 | 300 | 1.76e10 |

In contrast to deposition without $B_2H_6$, the inventors have discovered that when $B_2H_6$ is included in the process gas, the addition of nitrogen actually reduces film stress rather than increases it. This discovery was confirmed by way of an experiment in which nitrogen was added to both the nucleation and bulk deposition phases of tungsten film deposition. The $B_2H_6$ presoak step was not used. In the experiment, a nucleation step of 60 seconds included $WF_6$, $SiH_4$ and Ar flows of 5 sccm, 2 sccm and 2800 sccm, respectively. The bulk deposition step included $WF_6$, $H_2$ and Ar flows of 65 sccm, 1500 sccm and 2800 sccm, respectively. The results of this experiment are listed below in Table 5.

TABLE 5

CVD of Tungsten Films Using $B_2H_6$ and $N_2$

| $N_2$ (sccm) | $B_2H_6$ (sccm) | Thickness (Å) | Sheet Resistance (mohm/sq) | Uniformity % | Reflectivity (% avg*) | Stress (dynes/cm$^2$) |
|---|---|---|---|---|---|---|
| 100 | 0 | 1990 | 906 | 2.23 | 110.9 | 1.66e10 |
|  | 2 | 2072 | 656 | 5.89 | 109.7 | 1.84e10 |
|  | 4 | 1939 | 528 | 2.04 | 106.22 | 1.64e10 |
|  | 6 | 2041 | 499 | 1.16 | 106.04 | 1.86e10 |
|  | 7 | 2115 | 476 | 1.23 | 107.6 | 1.87e10 |
|  | 8 | 2190 | 460 | 1.31 | 106.97 | 1.94e10 |
|  | 10 | 2519 | 1414 | 83.07 | 124.5 | 2.02e10 |
| 300 | 0 | 1960 | 947 | 4.85 | 110.4 | 1.76e10 |
|  | 2 | 2223 | 685 | 5.79 | 111.27 | 1.7e10 |
|  | 6 | 2066 | 497 | 0.93 | 103.46 | 1.57e10 |
|  | 7 | 2121 | 479 | 1.18 | 98.22 | 1.57e10 |
|  | 8 | 2170 | 463 | 1.32 | 87.17 | 1.55e10 |

*Reflectance is an average of 9 points across the wafer

As evident from Table 5, increasing the amount of nitrogen in the process gas improves reflectivity and decreases stress of the deposited tungsten film without adversely effecting other characteristics such as uniformity or sheet resistance. Also, the addition of nitrogen has the additional benefit of eliminating haze that sometimes occurs on the substrate after deposition of a tungsten film using $B_2H_6$. This haze has been observed in some instances to replicate the pattern of the heater on the surface of the wafer. While it is not known that the haze produces detrimental physical properties in the deposited film, the addition of nitrogen to the process gas has been shown to eliminate the haze.

The process parameters set forth above with respect to the preferred embodiments are optimized for one particular deposition process run in a resistively heated MCVD chamber manufactured by Applied Materials that is outfitted for 200 mm wafers. In addition to varying processing parameters described above to deposit tungsten layers according to specific applications, a person of ordinary skill in the art will recognize that these preferred parameters are in part chamber specific and will vary if chambers of other design and/or volume are employed.

The parameters listed in the above preferred processes and the above-described experiments should not be limiting to the claims as described herein. One of ordinary skill in the art can also use parameters and conditions other than those described with respect to the preferred embodiment. As such, the above description is illustrative and not restrictive. For example, other sources of nitrogen such as $N_2O$ can be used in the process gas to reduce stress, and other inert gases, such as helium can be used in place of argon. Also, other process temperature and pressure values and other gas flow rates can be employed. The scope of the invention should, therefore, be determined not with reference to the above description, but instead should be determined with reference to the appended claims along with their full scope of equivalents. other nitrogen sources;

What is claimed is:

1. A chemical vapor deposition process for depositing a tungsten film on a substrate, said process comprising:
   (a) placing a substrate in a deposition zone;
   (b) introducing a tungsten-containing source and a first reduction agent into said deposition zone during a nucleation process stage;
   (c) during a first process stage after said nucleation process stage, introducing a group III or V hydride into said deposition zone without introducing a tungsten-containing source into said deposition zone; and
   (d) during a second process stage after said first stage,
      (i) introducing a process gas comprising a tungsten-containing source, a group III or V hydride and a second reduction agent into said deposition zone, and
      (ii) maintaining the deposition zone at process conditions suitable for depositing a tungsten layer on said substrate.

2. The chemical vapor deposition process set forth in claim 1 wherein a third reducing agent comprising $H_2$ is also introduced into said deposition zone during said third process stage.

3. The chemical vapor deposition process set forth in claim 1 wherein said tungsten-containing source comprises $WF_6$ and said group III or V hydride comprises $B_2H_6$ and said first reduction agent comprises $SiH_4$.

4. The chemical vapor deposition process set forth in claim 3 wherein said second reduction agent comprises $H_2$.

5. The process of claim 3 wherein said nucleation process stage also introduces $H_2$ into said deposition zone as an additional reduction agent.

6. The chemical vapor deposition process set forth in claim 1 wherein said process gas introduced during said second process stage further comprises a nitrogen-containing source.

7. The process of claim 1 wherein said second process stage is a thermal CVD process.

8. The process of claim 1 wherein $H_2$ is introduced into said deposition zone along with said group III or V hydride during said first process stage.

9. The process of claim 1 wherein a flow of argon is introduced into said deposition zone during said nucleation, said first and said second process stages.

10. A chemical vapor deposition process for depositing a tungsten film on a substrate, said process comprising:
    (a) placing a substrate in a process zone;
    (b) during a first process stage,
       (i) flowing a tungsten-containing gas and a first reduction agent into said deposition zone, and
       (ii) maintaining the deposition zone at process conditions suitable for depositing a first tungsten layer on said substrate;
    (c) during a second process stage after said first process stage, flowing a diborane gas into said deposition zone for between about 5–20 seconds without flowing a tungsten-containing gas into said deposition zone, and
    (d) during a third process stage after said second stage,
       (i) flowing a process gas comprising a tungsten-containing source, diborane and a second reduction agent into said deposition zone, and
       (ii) maintaining the deposition zone at process conditions suitable for depositing a second tungsten layer over said first layer.

11. The method of claim 10 wherein said second process stage further comprises the step of flowing an inert gas into said deposition zone to purge said deposition zone of residual gases from said first process stage prior to flowing said third stage process gas into said deposition zone.

12. The method of claim 11 wherein said third process stage, process gas further comprises nitrogen.

13. The method of claim 12 wherein during step (i) of said second process stage, said tungsten-containing gas comprises $WF_6$ and wherein said diborane is diluted in argon at a ratio of about 5% or less.

14. The process of claim 10 wherein said third process stage is a thermal CVD process.

15. The process of claim 10 wherein said first reduction agent comprises $SiH_4$ and said second reduction agent comprises $H_2$.

16. A chemical vapor deposition process for depositing a tungsten film on a substrate, said process comprising:
   (a) placing a substrate in a deposition zone;
   (b) during a first process stage,
      (i) introducing a process gas comprising a tungsten-containing source and a first reduction agent into said deposition zone, and
      (ii) maintaining the deposition zone at process conditions suitable to deposit a first tungsten layer over said substrate; and
   (c) during a second process stage after said first stage,
      (i) introducing a process gas comprising a tungsten-containing source, a nitrogen-containing source, a group III or V hydride and a second reduction agent into said deposition zone, and
      (ii) maintaining the deposition zone at process conditions suitable for depositing a second tungsten layer over said first tungsten layer.

17. The chemical vapor deposition process set forth with respect to claim 16 wherein said process gas in said second process stage further comprises a nitrogen-containing source.

18. The chemical vapor deposition process set forth with respect to claim 16 further comprising:
   (d) an intermediary process stage, between to said first and second process stages, wherein a group III or V hydride is introduced into said deposition zone without introducing a tungsten-containing source.

19. The chemical vapor deposition process set forth with respect to claim 16 wherein said group III or V hydride comprises $B_2H_6$.

20. The chemical vapor deposition process set forth with respect to claim 19 wherein said nitrogen-containing source comprises $N_2$.

21. The process of claim 16 wherein said first reduction agent comprises $SiH_4$ and said second reduction agent comprises $H_2$.

22. The process of claim 21 wherein said first process stage further comprises a third reduction agent comprising $H_2$.

23. A chemical vapor deposition process for depositing a tungsten film on a substrate, said process comprising:
   (a) placing a substrate in a process zone;
   (b) during a first process stage,
      flowing a first process gas comprising $WF_6$ and $SiH_4$ into said deposition zone and maintaining the deposition zone at process conditions suitable for depositing a first tungsten layer on said substrate;
   (c) during a second process stage after said first process stage, stopping the flow of said first process gas and thereafter, flowing a diborane gas into said deposition zone for between about 5–20 seconds without flowing a tungsten-containing source into said deposition zone; and
   (d) during a third process stage after said second stage, flowing a second process gas comprising $WF_6$, diborane and molecular hydrogen into said deposition zone and maintaining the deposition zone at process conditions suitable for depositing a second tungsten layer over said first layer.

* * * * *